(12) United States Patent
Findley

(10) Patent No.: US 6,243,653 B1
(45) Date of Patent: Jun. 5, 2001

(54) METHODS AND APPARATUS FOR EXTRACTING PARASITIC CAPACITANCE VALUES FROM A PHYSICAL DESIGN OF AN INTEGRATED CIRCUIT

(75) Inventor: Paul R. Findley, Cupertino, CA (US)

(73) Assignee: VLSI Technology, Inc., Sunnyvale, CA (US)

(*) Notice: Subject to any disclaimer, the term of this patent is extended or adjusted under 35 U.S.C. 154(b) by 0 days.

(21) Appl. No.: 09/135,105

(22) Filed: Aug. 17, 1998

(51) Int. Cl.[7] .................................................. G01R 27/26
(52) U.S. Cl. ................................................ 702/65; 716/10
(58) Field of Search ........................... 700/97, 104, 108, 700/292, 95, 182, 25; 702/65; 703/13, 14, 22; 714/742; 716/135.4, 2.8, 10

(56) References Cited

U.S. PATENT DOCUMENTS

| | | | |
|---|---|---|---|
| 5,243,547 | * 9/1993 | Tsai et al. | 364/578 |
| 5,367,469 | * 11/1994 | Hartoog | 364/491 |
| 5,634,093 | * 5/1997 | Ashida et al. | 395/143 |
| 5,699,265 | * 12/1997 | Scepanovic et al. | 364/491 |
| 5,761,080 | * 6/1998 | DeCamp et al. | 364/490 |
| 5,793,641 | * 8/1998 | Sayah | 364/488 |
| 5,801,960 | * 9/1998 | Takano et al. | 364/491 |
| 5,885,856 | * 3/1999 | Gilbert et al. | 438/129 |
| 5,983,006 | * 11/1999 | Carlson et al. | 395/500.05 |
| 6,028,989 | * 2/2000 | Dansky et al. | 395/500.09 |
| 6,061,508 | * 5/2000 | Mehrotra et al. | 395/500.07 |
| 6,099,580 | * 8/2000 | Boyle et al. | 716/7 |
| 6,106,563 | * 8/2000 | Strengel et al. | 703/13 |
| 6,145,117 | * 11/2000 | Eng | 716/18 |

\* cited by examiner

*Primary Examiner*—Marc S. Hoff
*Assistant Examiner*—Edward Raymond
(74) *Attorney, Agent, or Firm*—Wells, St. John, Roberts, Gregory & Matkin, P.S.

(57) ABSTRACT

Computer-implemented methods and apparatus for extracting and computing parasitic capacitance values and capacitances respectively, from a physical design of an integrated circuit are described. In one embodiment, the physical design comprises a plurality of layered conductors which are disposed within a first dielectric material. At least one conductor of the plurality of conductors is identified, and for the identified conductor, the first dielectric material is replaced for calculational purposes with a second (fictitious) dielectric material having a dielectric constant which is higher than the dielectric constant of the replaced dielectric material. In general, the second dielectric may have a different dielectric constant for each identified layer or elevation. Parasitic capacitance values are then computed for the integrated circuit. In a preferred embodiment, spaced-apart conductors at a common substrate elevation are identified, and a distance between the conductors is determined. If the determined distance exceeds a predetermined distance value, the first dielectric material is replaced with the second dielectric material. Such provides a basis for extracting parasitic capacitance values and computing one or more parasitic capacitances which more accurately represents the effect of the presence of fill structures within the physical integrated circuit.

42 Claims, 8 Drawing Sheets

METHODS AND APPARATUS FOR EXTRACTING PARASITIC CAPACITANCE VALUES FROM A PHYSICAL DESIGN OF AN INTEGRATED CIRCUIT

TECHNICAL FIELD

This invention pertains to methods and apparatus for extracting parasitic capacitance values from a physical design of an integrated circuit.

BACKGROUND OF THE INVENTION

An integrated circuit can contain millions of electrical components such as transistors, resistors, capacitors and diodes, and their associated interconnections, which are usually made through conductive materials comprising deposited metal, polysilicon and the like. An integrated circuit's components and their interconnections are typically arranged in a plurality of layers which are formed over a substrate typically comprising a silicon wafer. Each layer, or common substrate elevation, can contain several thousand conductors. Such conductors are typically electrically insulated from one another by a non-conducting material or dielectric material such as borophosphosilicate glass (BPSG), silicon dioxide, and the like.

Figure 1:
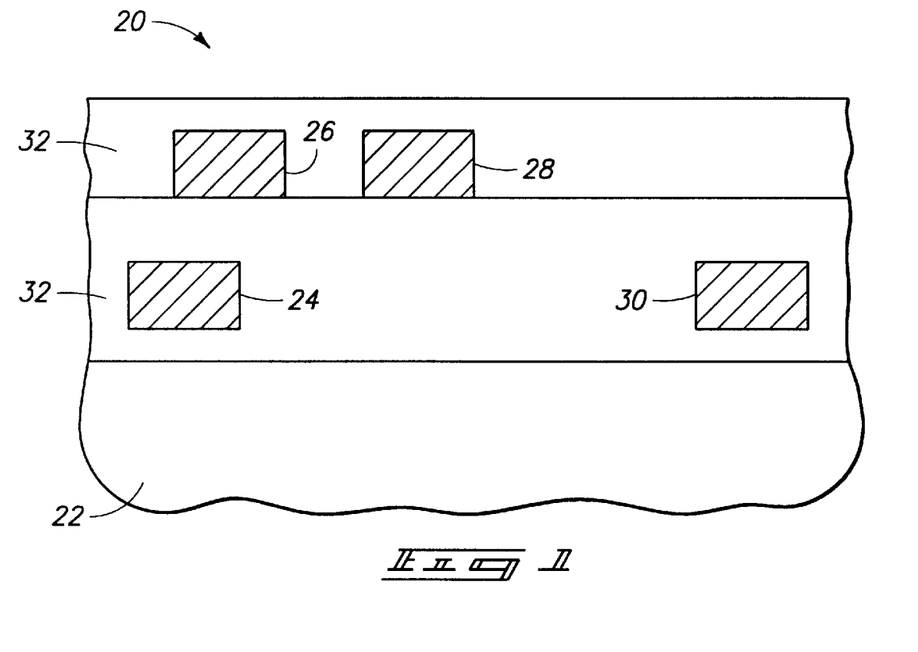
FIG. 1 is a diagrammatic side sectional view of a semiconductor wafer fragment having a plurality of conductors.

Shown in FIG. 1, generally at 20, is a semiconductor wafer fragment comprising a substrate 22, and a plurality of conductors 24, 26, 28, and 30. The conductors are separated from one another, and insulated by dielectric material layers 32, which may or may not comprise the same material. The spacing vertically and laterally of conductors 24–30 can lead to a phenomenon known as parasitic capacitance. Capacitance is a natural phenomenon which exists between any two conductors which are not electrically connected to each other; the closer the proximity of the conductors, the larger the capacitance. Parasitic capacitance is so named because it is an undesirable effect resulting from the very close proximity of conductors in an integrated circuit.

Figure 2:
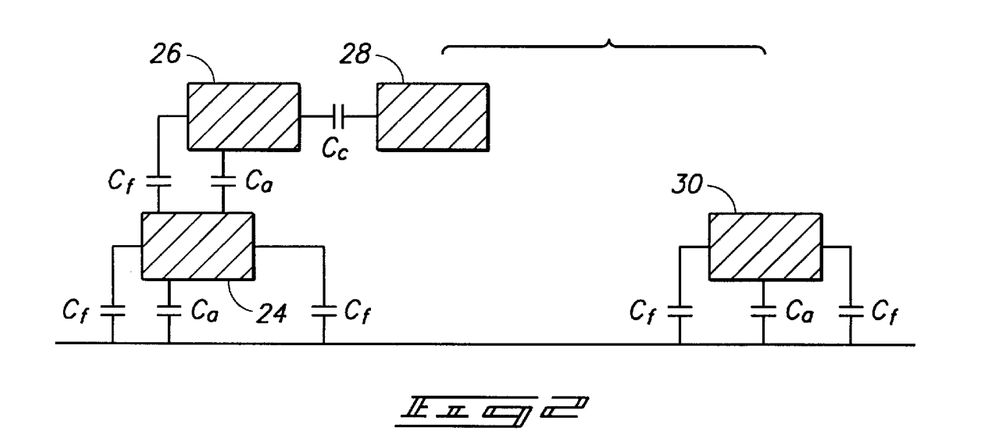
FIG. 2 is a view of the FIG. 1 conductors separated from the FIG. 1 wafer fragment and showing exemplary parasitic capacitances.

Referring to FIG. 2, conductors 24–30 are shown for clarity without the dielectric layer boundaries. There, some exemplary parasitic capacitances are schematically shown as capacitor elements which are joined between laterally adjacent and overlying conductors. To calculate the parasitic capacitance attributed to an integrated circuit conductor, the capacitance can be broken into components, and modeled as shown in FIG. 2. Three different components of parasitic capacitance are shown and comprise an area capacitance ($C_a$), a coupling or lateral capacitance ($C_c$), and a fringing or fringe capacitance ($C_f$).

The area capacitance, $C_a$ is the component of parasitic capacitance which exists between the top and bottom surfaces of two overlapping conductors. Accordingly, portions of the top surface of conductor 24 are overlapped by portions of the bottom surface of conductor 26. Hence, a parasitic area capacitance can be developed therebetween.

Lateral coupling capacitance, $C_c$, is the component of parasitic capacitance which exists between adjacent lateral edges of two conductors. Accordingly, the adjacent lateral edges of conductors 26, 28 can give rise to the illustrated coupling capacitance $C_c$.

Fringing or fringe capacitance, also termed edge capacitance, is the component of parasitic capacitance which exists between a lateral edge of a first conductor, and either the top or bottom surface of a second conductor which overlaps (underlaps) the lateral edge of the first conductor. Accordingly, the leftmost side edge of conductor 26 and the top of conductor 24 can give rise to a fringe capacitance $C_f$. The fringe capacitance is essentially a distortion to the area capacitance component caused by fringing effects at a conductor's lateral edges. Similarly, there are area and fringe components of capacitance between metals and the semiconductive substrate, as illustrated.

An undesirable effect of parasitic capacitance is to slow the propagation of electrical signals through a circuit, thereby reducing the speed at which an integrated circuit can function. The larger the parasitic capacitance, the greater the delay a signal will encounter as it travels through a conductor. If the parasitic capacitance components of an integrated circuit can be extracted from the integrated circuit's physical design, such components can be used to estimate the delay for each signal in the circuit, through a process known as timing analysis. This information can be used to adjust the physical layout of the conductors in an integrated circuit, thereby optimizing the performance of the integrated circuit.

Typically, within the integrated circuit industry, there are a number of so-called extraction tools, e.g. layout parasitic extractors (LPEs), which are designed to enable circuit designers to extract and analyze such parasitic capacitances. Among these tools are included the Caliber™ and xCaliber™ physical verification and extraction tools available from Mentor Graphics Corporation, 8005 S.W. Boeckman Road, Wilsonville, Oreg. 97070. Such extraction tools are described in a publication entitled *Interconnect Parasitic Extraction for Deep Submicron IC Design*, which is available through Mentor Graphics.

In contemporary integrated circuit processing, it is not unusual to employ the use of so-called dummy fill patterns, or fill structures to help in the attainment of process uniformity. Such fill structures are circuit features, such as polysilicon or metal bars, which are deposited and patterned, and may serve no electrical function, but are present in the circuit's topology simply to even out the physical effects in wafer processing steps. As such, they are usually not connected to any circuit node, and are therefore said to be "electrically floating." In contrast to dummy metal, we will refer to the original signal-carrying metal as "active" metal. Exemplary uses of such fill structures are to achieve photolithographic uniformity, etch uniformity, and/or planarization uniformity. That is, when a wafer is planarized, as by chemical-mechanical polishing, such fill structures can facilitate an evenly planarized surface which, in the absence of such fill structure, could dip inwardly or have other non-uniform features.

Figure 3:
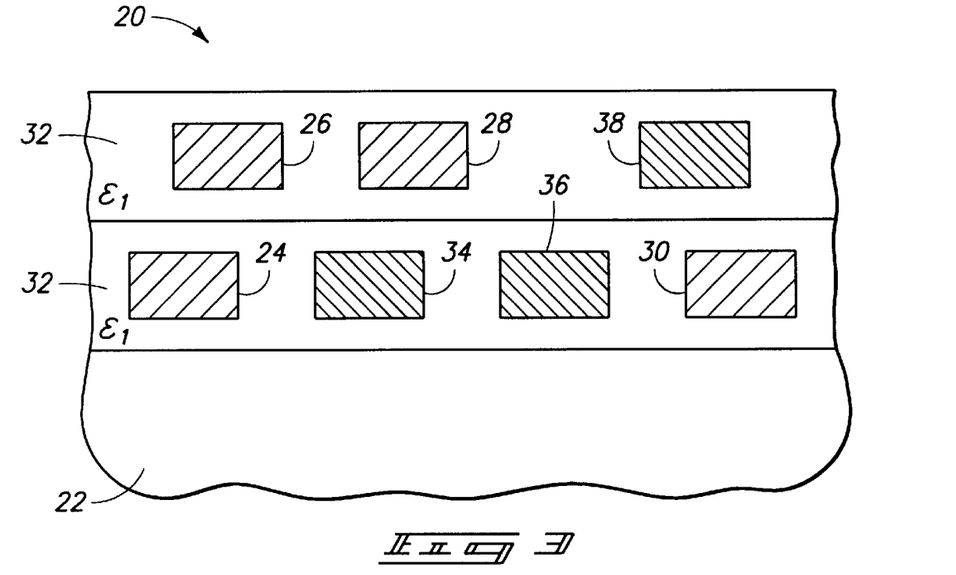
FIG. 3 is a view of a semiconductor wafer fragment having a plurality of fill structures supported proximate a plurality of conductors.

As an example, FIG. 3 shows the above-described FIG. 1 conductors 24–30, with exemplary fill structures 34, 36, and 38. While the fill structures are useful in providing an enhanced degree of process uniformity, such fill structures can give rise to parasitic electrical effects, such as increasing the parasitic capacitance of the active metal. Such is usually undesirable for all of the reasons set forth above.

Figure 4:
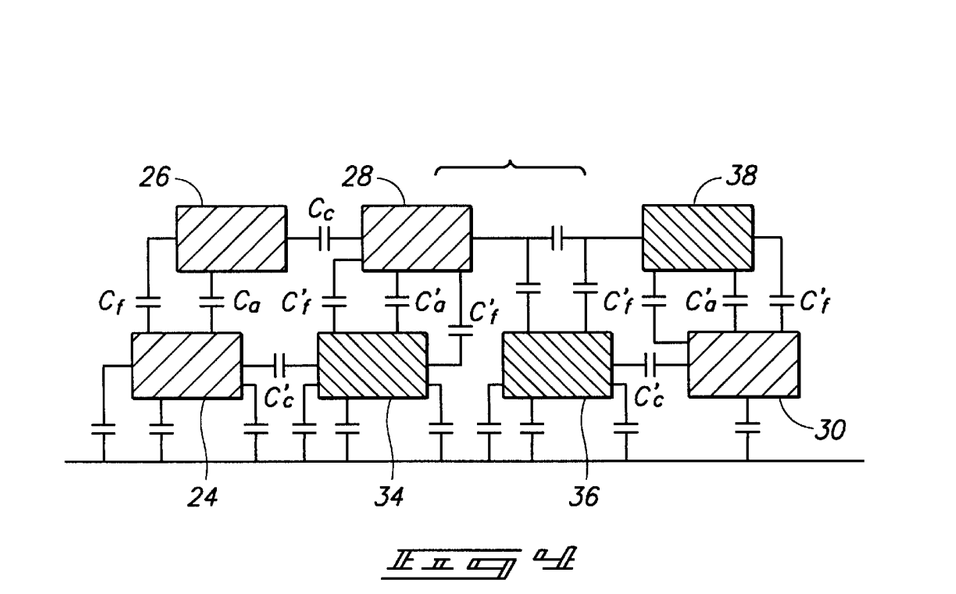
FIG. 4 is a view of the FIG. 3 conductors and fill structures illustrating additional parasitic capacitances developed by the fill structures.

For example, FIG. 4 shows conductors 24–30, and fill structures 34–38 with the exemplary parasitic capacitances schematically indicated. With respect to conductor 24, additional parasitic capacitance to other active layers develops due to its coupling capacitance $C_c'$ to fill structure 34 and fill structure 34's coupling to other active conductors or semiconductors. With respect to conductor 28, parasitic fringe capacitances $C_f'$, and area capacitance $C_a'$ develop with fill structure 34. With respect to conductor 30, a parasitic coupling capacitance $C_c'$ develops with fill structure 36, and fringe capacitances $C_f'$, and area capacitance $C_a'$ develop with fill structure 38. Each fill structure in turn has capacitances to other active metal, and the total capacitance of each active metal when calculated according to standard methods familiar to practitioners in the field, is increased relative to the case when there is no dummy metal fill, despite the dummy metal being electrically floating. As mentioned above, these additional parasitic capacitances can give rise to undesirable parasitic effects.

A problem which has arisen with respect to conventionally available layout parasitic extractors (LPEs), is that such extractors do not typically take into account the presence of such fill structures during calibration and extraction of parasitic capacitances. Accordingly, the extracted parasitic capacitances by LPE do not include the increased parasitic effects generated by these fill structures. Accordingly, functional and performance simulations are run based on integrated circuitry structure which does not include the effects of the fill structure. Hence, a level of inaccuracy is injected into the computation of parasitic capacitances, and the evaluation of the subject integrated circuitry.

One reason for the inability to account for the fill structures is that the fill structure pattern is often incorporated into the integrated circuit design as a last step before mask tooling, after the functional and performance simulations and the layout parasitic extraction (LPE). In the normal design flow, the LPE processes the physical layout of the integrated circuit, and based upon a calibrated set of equations or tables, translates the geometric arrangement of metals or conductors into electrical capacitances and resistances, and places them into a circuit simulation input file. If the fill structure pattern does not exist in the physical layout database, then the LPE normally cannot account for its electrical effect. Thus, in the normal design flow, the parasitic capacitive effects of the extra fill structures are not represented in these circuit simulations.

One solution might be to incorporate the fill structure pattern into the design before the LPE and verification simulations. However, it is usually impractical to include as much layout data as the pervasive fill structure pattern would represent in the design database, both from a storage resource standpoint, and, in the run times and run time resources that would be required to perform the usual operations on the database that are part of the normal design flow. It is also a common limitation of present day LPE tools not to be able to accurately extract the effects of floating metal. If one were to connect the floating metal to active nodes, the LPE tool may in principle be able to handle it, but the parasitic capacitances would increase enormously.

Accordingly, this invention arose out of concerns associated with improving the methods and apparatus through which parasitic capacitance values are extracted from physical integrated circuit designs. In particular, this invention arose out of concerns associated with providing methods and apparatus which take into account the parasitic capacitive effects caused by fill structures such as that described above.

SUMMARY OF THE INVENTION

Computer-implemented methods and apparatus for extracting and computing parasitic capacitance values and capacitances respectively, from a physical design of an integrated circuit are described. In one embodiment, the physical design comprises a plurality of layered conductors which are disposed within a first dielectric material. At least one conductor of the plurality of conductors is identified, and for the identified conductor, the first dielectric material is replaced for calculational purposes with a second (fictitious) dielectric material having a dielectric constant which is higher than the dielectric constant of the replaced dielectric material. In general, the second dielectric may have a different dielectric constant for each identified layer or elevation. Parasitic capacitance values are then computed for the integrated circuit. In a preferred embodiment, spaced-apart conductors at a common substrate elevation are identified, and a distance between the conductors is determined. If the determined distance exceeds a predetermined distance value, the first dielectric material is replaced with the second dielectric material. Such provides a basis for extracting parasitic capacitance values and computing one or more parasitic capacitances which more accurately represents the effect of the presence of fill structures within the physical integrated circuit.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

The drawings and this description, in general, disclose methods and apparatus of extracting and computing parasitic capacitance values from a physical design of an integrated circuit. Preferably, methods of calibrating a layout parasitic extractor (LPE), and a calibrated LPE enable extraction of parasitic capacitance values which take into account integrated circuitry structure, such as fill structure, which may not necessarily comprise a part of a physical integrated circuit design received by and operated upon by circuit simulation and verification programs and apparatus.

Figure 10:
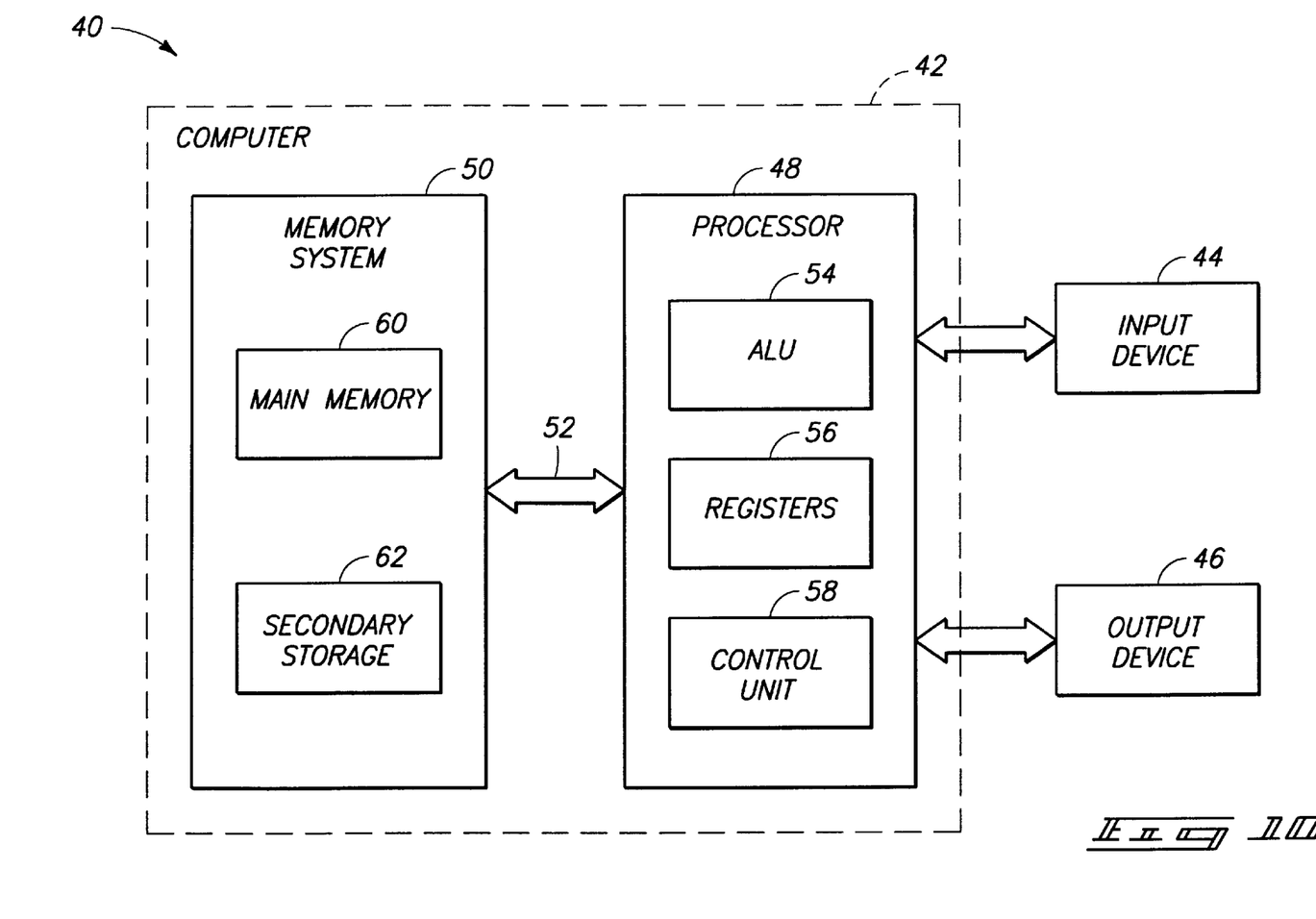
FIG. 10 is a block diagram of a general purpose computer in accordance with one embodiment of the present invention.

FIG. 10 is a block diagram of a computer system 40 which can be used to implement the methods and apparatus embodying the invention described below. Computer system 40 includes as its basic elements a computer 42, an input device 44, and an output device 46. Computer 42 generally includes a central processing unit or processor 48 and a memory system 50 that communicate through a bus structure 52. Processor 48 includes an arithmetic logic unit (ALU) 54 for performing computations, registers 56 for temporary storage of data and instructions, and a control unit 58 for controlling the operation of computer system 40 and responds to instructions from a computer program such as an application or an operating system.

Memory system 50 generally includes high-speed main memory 60 in the form of a medium such as random access memory (RAM) and read only memory (ROM) semiconductor devices, and secondary storage 62 in the form of a medium such as floppy disks, hard disks, tape, CD-ROM, etc., and other devices that use optical or magnetic recording material. Main memory 60 stores programs such as a computer's operating system and currently running application programs. Main memory 60 also includes video display memory for displaying images through a display output device 46. Memory system 50 can provide computer-readable media having resident thereon computer programs containing instructions which, when executed by a computer, implement one or more of the methods described below.

Input device 44 and output device 46 are typically peripheral devices connected by a bus structure to computer 42. Input device 44 may be a keyboard, modem, pointing device, pen, or other device for providing input data to the computer. Output device 46 may be a display device, printer, modem, sound device or other device for providing output data from the computer. The input and output devices may be physically combined into a single device is desired.

It should be understood that FIG. 10 is a block diagram illustrating the basic elements of a computer system 40; the Figure is not intended to illustrate a specific architecture for a computer system 40. For example, no particular bus structure is shown because various bus structures known in the field of computer design may be used to interconnect the elements of the computer system in a number of ways, as desired. Processor 48 may be comprised of a discrete ALU 54, registers 56, and control unit 58, or may be a single device in which these parts of the processor are integrated together, such as in a microprocessor. Moreover, the number and arrangement of elements of the computer system may be varied from what is shown and described in ways known in the art.

Figure 11:
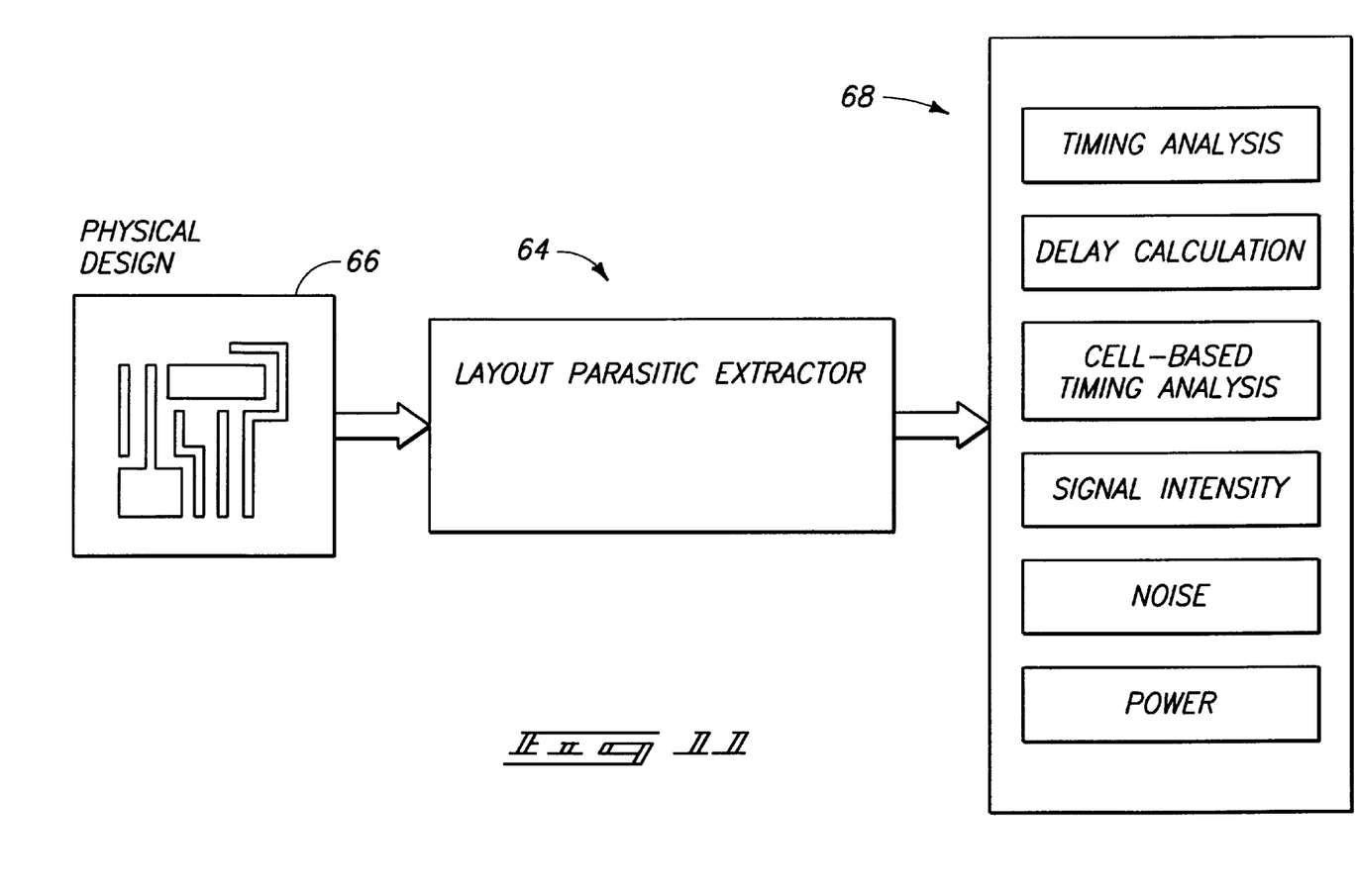
FIG. 11 is a high-level view of a layout parasitic extractor in accordance with one embodiment of the present invention.

In a preferred embodiment, computer system 40 is programmed, via software programs resident in memory system 50, as a layout parasitic extractor, such as the one shown generally at 64 in FIG. 11. The layout parasitic extractor is preferably configured to extract parasitic capacitance values from a physical design 66 of an integrated circuit and transform or translate the physical design into a computer-usable form in which the parasitic capacitance values can used. In one implementation, the transformation function implemented by layout parasitic extractor 64 translates physical design 66 into a circuit simulation input file which can be utilized, by the computer, to effect a number of different analyses which are set forth generally at 68. Such include timing analysis, delay calculation, cell-based timing analysis, signal integrity, noise, and power analyses and the like. Such analyses are simply illustrative and not intended to be limiting.

With an exemplary system having been described, a description is now set forth of various inventive methods.

Figure 5:
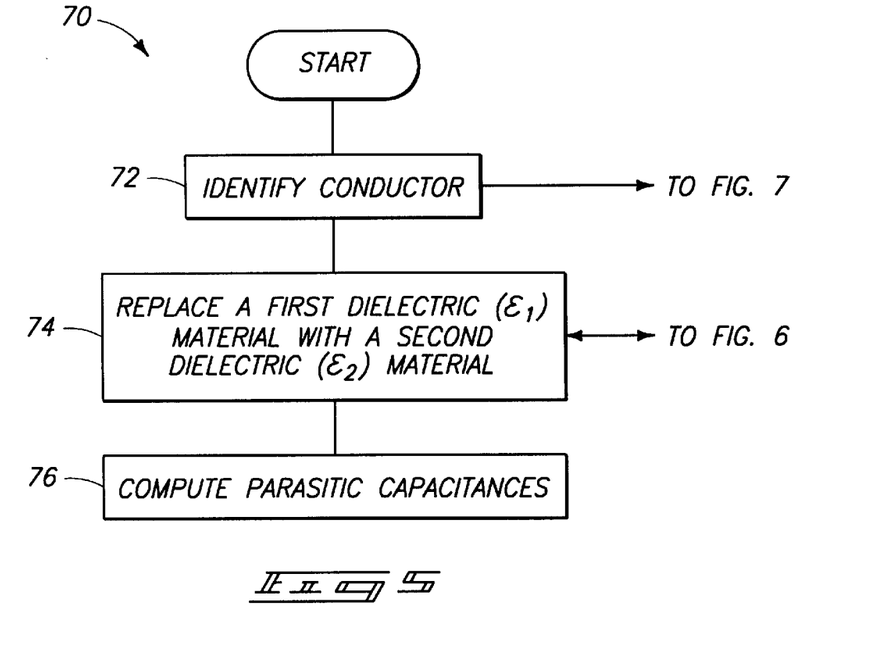
FIG. 5 is a high-level block diagram of certain methodical steps in accordance with one embodiment of the invention.
Figure 6:
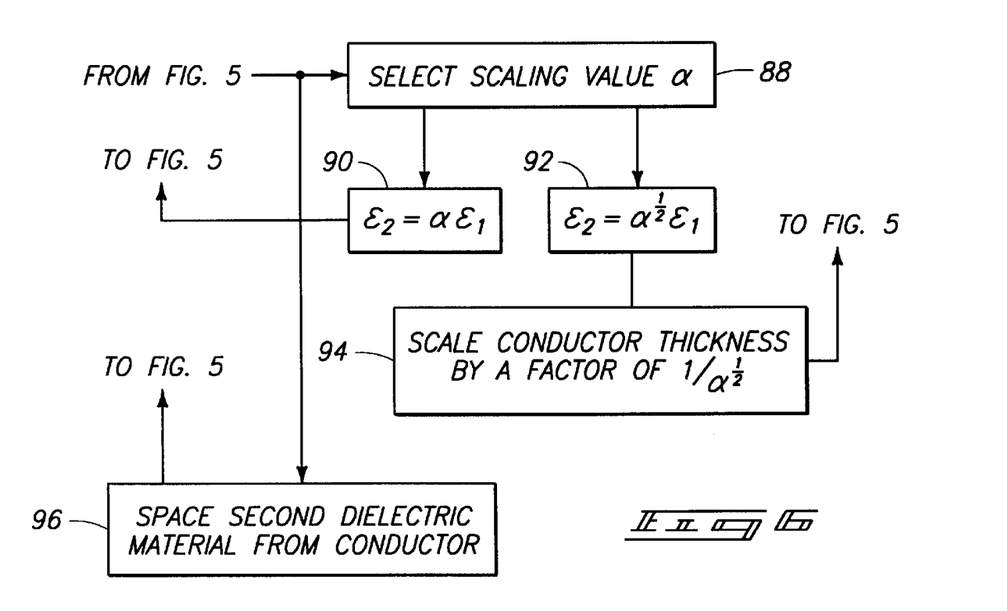
FIG. 6 is a continuation of the FIG. 5 flow diagram.

Referring to FIG. 5, a flow diagram is set forth which indicates, generally, methodical steps in accordance with one implementation of the invention. The methodical steps can be implemented in any suitable hardware, software, firmware or combination thereof. The various methods described below are preferably computer-implemented and provide for the extraction of parasitic capacitance values from a physical design of an integrated circuit and computation of associated parasitic capacitances.

At step 72, at least one conductor is identified from the integrated circuit's physical design. The identification can be accomplished by identifying conductive layers or elevations for which fill structures will be used. For the identified conductor, at step 74, a first dielectric material having a first dielectric constant $\epsilon_1$, and which is disposed adjacent the one conductor is replaced, for computational purposes, with a second dielectric material having a dielectric constant $\epsilon_2$ which is different from, and preferably higher than dielectric constant $\epsilon_1$. With the first dielectric material having been replaced, one or more parasitic capacitance values can now be extracted, and parasitic capacitances computed for the integrated circuit including the one conductor. It will be appreciated that the replacement of the first dielectric material with the second dielectric material preferably has the desirable effect of enabling parasitic capacitances to be computed for surrounding metals and semiconductive structures which more accurately represent the actual parasitic capacitances of the finished integrated circuitry.

By replacing the first dielectric material with a second dielectric material having a higher dielectric constant, the inventive methods anticipate and account for fill structures that will eventually become part of the physical integrated circuit. For the real-world case of finite-sized fill structure, such as that described above, the effective dielectric constant which is seen by each affected conductor will increase. This invention was motivated by visualizing the fill structure as small floating metal particles dispersed uniformly throughout the dielectric, and realizing that the net effect would be an increase in the polarizability (or equivalently, dielectric constant) of this new medium relative to the original dielectric. Accordingly, approximating the real-world fill structure as a dielectric material of a different, and preferably higher dielectric constant, facilitates parasitic extraction and calculation of parasitic effects with more accuracy than if such fill structure were ignored.

Figure 7:
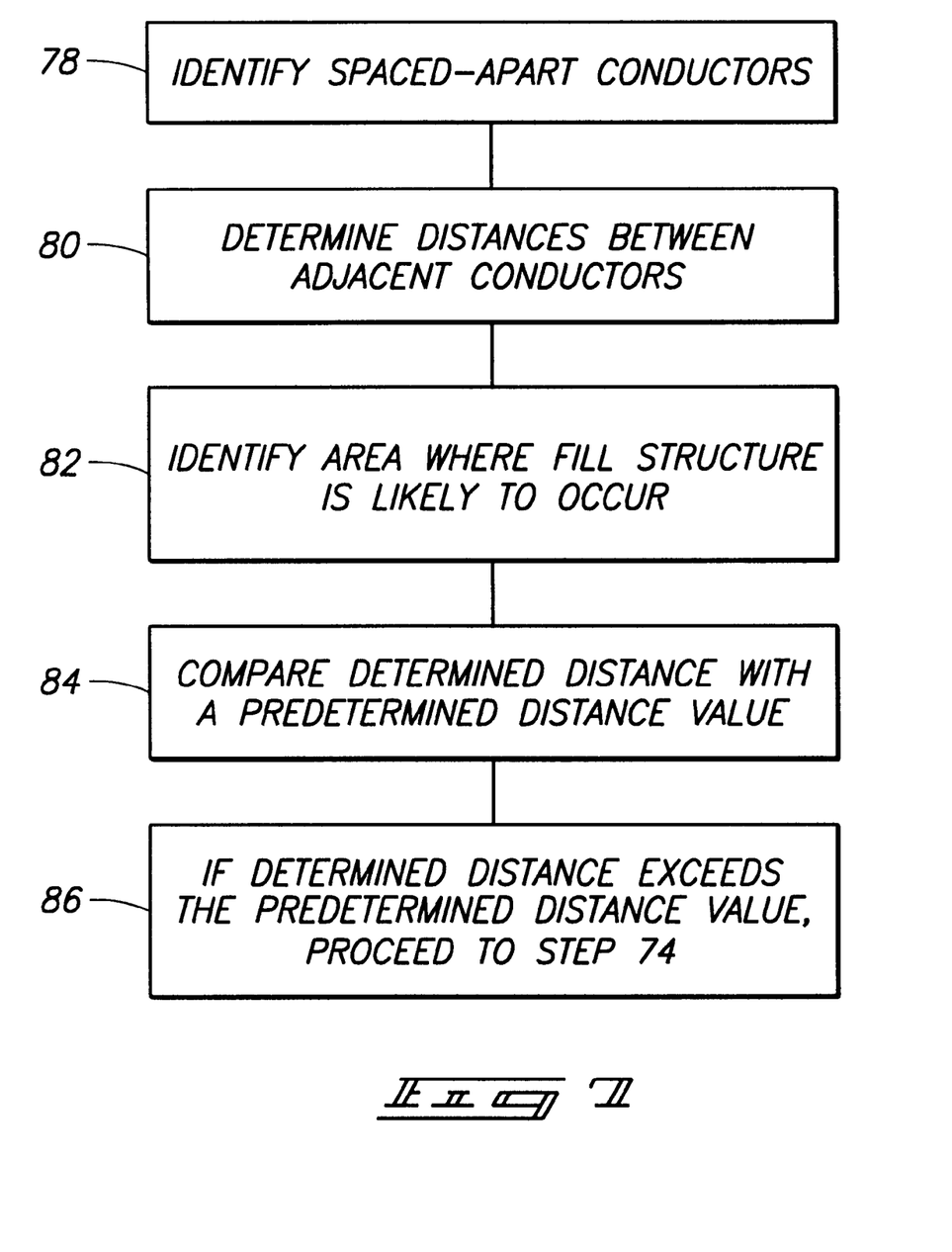
FIG. 7 is a continuation of the FIG. 5 flow diagram.

Referring to FIG. 7, and in a preferred embodiment which branches from step 72 in FIG. 5, the identification of the conductor if comprises identifying a pair of laterally spaced-apart conductors at step 78. At least some of the identified conductors can be spaced apart sufficiently to accommodate fill structures therebetween. Exemplary sufficiently spaced conductors are shown in FIG. 3 as conductors 24, 30. An example of conductors which are not spaced apart sufficiently to accommodate fill structure is shown by conductors 26, 28. At step 80, respective distances between adjacent conductors are determined for the purpose of ascertaining or identifying, at step 82, in which areas fill structures are likely to occur. The determined distances are compared, at step 84, with a predetermined distance value. Responsive to a determined individual distance exceeding the predetermined distance value in step 84, the first dielectric material between the conductors is replaced with a second dielectric material, as set forth at step 74 in FIG. 5. Accordingly, one or more parasitic capacitance values can be extracted, and parasitic capacitances computed for the plurality of the conductors which, in effect, takes into account the actual resultant parasitic capacitance imparted to the integrated circuit by the fill structure.

Figure 8:
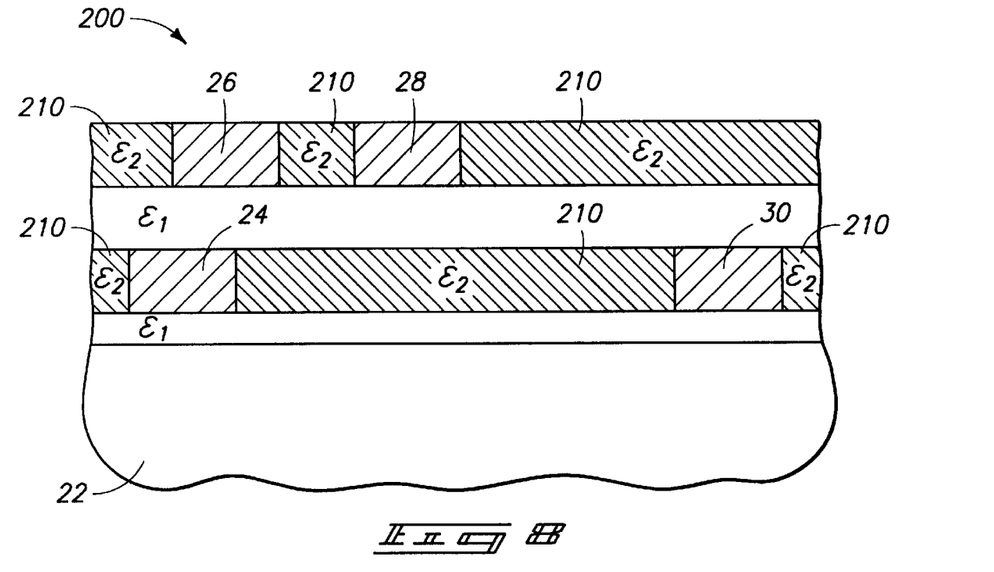
FIG. 8 is a representational view of an effective structure provided via one embodiment of the present invention.
Figure 9:
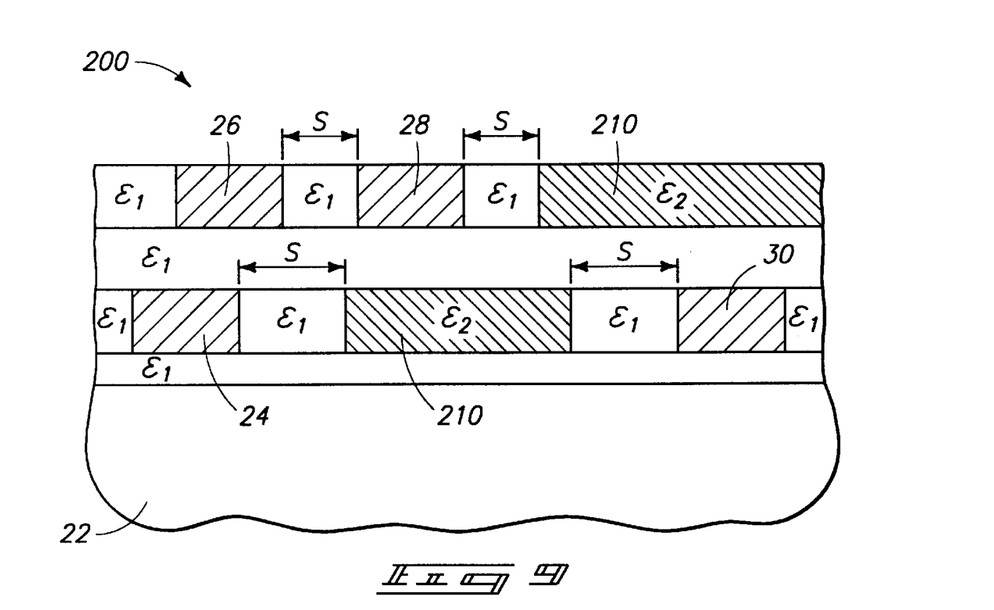
FIG. 9 is a representational view of an effective structure provided via another embodiment of the present invention.
Figure 12:
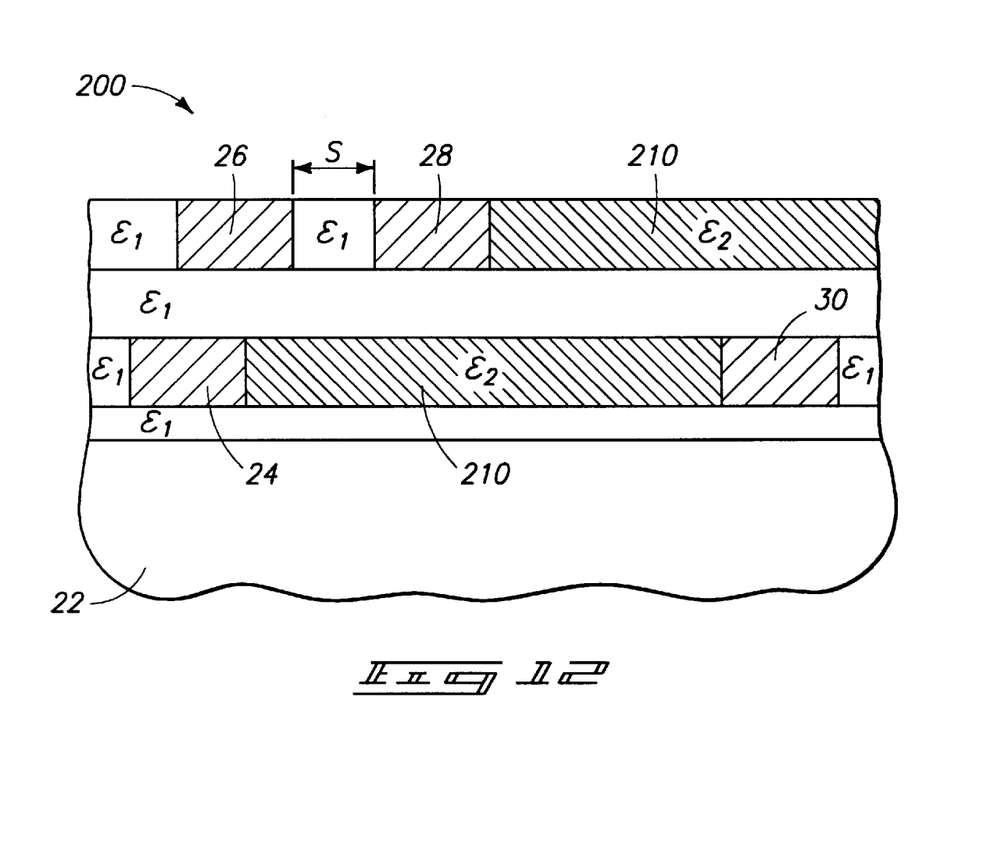
FIG. 12 is a representational view of an effective structure provided via one embodiment of the present invention.

Exemplary effective physical designs which are "seen" or produced, for simulation purposes, in accordance with the method just described are shown in FIGS. 8, 9 and 12 generally at 200. There, wherein the second dielectric material is shown at 210 adjacent and between, or, in some instances, spaced apart from (or entirely absent from between) selected conductors at common substrate elevations as will become apparent below. It is these effective physical designs which can be utilized by various extraction and verification tools to calculate simulation values and verify circuit performance.

In a preferred embodiment, the second dielectric constant $\epsilon_2$ is selected such that one or more of the computed parasitic capacitances is within a predetermined range of an actual physical parasitic capacitance which is imparted by fill structures such as those shown at 34, 36 and 38 (FIG. 3). In one aspect, a scaling value $\alpha$ is selected at step 88, such that $\epsilon_2 = \alpha \epsilon_1$ (step 90). Selection of an $\alpha$ value is such that the computed parasitic capacitance is approximately equal to the actual physical parasitic capacitance for the integrated circuit. Of course, $\alpha$ values can be selected such that one or more of the computed parasitic capacitances are within the predetermined range, and preferably approximately equal to the actual respective physical parasitic capacitance to which each corresponds.

In accordance with this and other methods to be described, well-known field solvers can be used to solve the physical case, and either a field solver or dielectric constant-dependent empirical equations can be used to assess the capacitances for the fictitious or effective case. The field solvers can be either two-dimensional or three-dimensional, depending on the complexities of the conductor and fill structure layout.

In the implementation first described, there can be a tendency to over estimate the parasitic capacitances, such as the coupling capacitance between closely-spaced conductor 26, 28 (FIG. 8), because there would be no actual physical fill structure therebetween, i.e. it would not fit, to increase the dielectric constant seen by these conductors, yet, an effective second dielectric material would be placed therebetween. In such cases, and in accordance with another embodiment, a scaling value $\alpha$ is selected, at step 92, such that $\epsilon_2 = \alpha^{1/2} \epsilon_1$. At step 94, one or more of the thicknesses of the subject conductors is (are) scaled by a factor of $1/\alpha^{1/2}$, such that the computed parasitic capacitance comprising the coupling capacitance between a pair of affected conductors, e.g. conductors 26, 28 (FIG. 8), is within a predetermined range, and preferably approximately equal to the actual physical parasitic coupling capacitance. Such solution can be acceptable in designs which are dominated by tightly packed metal. Such can, however, affect the fringe capacitance estimations because of the different dependence of the sidewall fringe capacitance on conductor thickness and dielectric constant. Accordingly, in another embodiment, the second dielectric material is spaced, at step 96, a desired distance from one or more of the conductors. Such is shown in FIG. 9 where second dielectric material having a dielectric constant $\epsilon_2$ is spaced from conductors 24, 26, 28, and 30, and thereby is excluded from between conductors 26, 28. The spacing can be similar or different in dimension, the latter being depicted in the drawing.

In another embodiment which is shown in FIG. 12, the second dielectric material replaces the first dielectric material, similar to the FIG. 8 embodiment, with there being no offset or spacing between the second dielectric material and next adjacent conductors. For example, the second dielectric material abuts the rightmost edge of conductor 28. Such can, in some instances, be tolerated because the coupling capacitance for adjacent metals beyond a large-enough chosen spacing is small enough as compared with the other capacitances that concerns over over-counting parasitic capacitances is reduced.

In a preferred embodiment, a spacing value is selected and the second dielectric material is placed no closer to the conductors than the selected spacing value. In another preferred embodiment, the spacing value is selected such that the computed parasitic fringe capacitance of the affected conductor is within a predetermined range, and preferably approximately equal, to the actual physical parasitic fringe capacitance of the one conductor. Spacing values can be selected to comprise values at which the coupling capacitance becomes small compared to the total capacitance such that over estimates for the coupled conductors separated by a greater spacing is unimportant. Alternatively, spacing values can be selected to comprise a critical spacing value which substantially satisfies pertinent design rules for minimum conductor-to-fill structure spacing.

In another embodiment, replacement of the first dielectric material with the second dielectric material can take place only where there will be, or where there is a high probably that there will be, an intervening fill structure disposed between two common-plane conductors, such as conductors 24, 30 (FIG. 3). The appropriateness of such replacement can be determined by ascertaining the spacing between the subject conductors, and responsive to the spacing failing to meet a desired condition, e.g. greater than some predetermined distance value, the second dielectric can be excluded. In the event the spacing meets the desired condition, the second dielectric can be included as described above.

In another embodiment, an integrated circuit performance simulation program is provided which analyzes the parasitic capacitance effects which will be imparted to a fabricated integrated circuit by a finite-sized structure. In one aspect, such is accomplished by replacing, for simulation purposes, the finite-sized structure with a simulated dielectric material having a dielectric constant selected to approximate the imparted parasitic capacitance effects. The replacement of the finite-sized structure can be accomplished by determining, from a physical layout of the integrated circuit, an area in which the finite-sized structure is to be located. In the illustrated and preferred embodiment, the finite-sized structure will not comprise a part of the physical layout. Accordingly, an examination can be made of the physical layout in accordance with predefined rules to ascertain areas in which the finite structure is to be replaced. In a preferred embodiment, the predefined rules look for conductive structures, such as the conductors described above, and ascertain which areas laterally proximate the conductive structures the finite-sized structures will likely occur. The replacement of the finite-sized structures with the simulated dielectric material then approximates the parasitic capacitances imparted relative to the conductive structures. In analyzing the parasitic capacitance effects, the circuit performance simulation program can extract parasitic capacitance values from the physical layout and compute the associated parasitic capacitances of the integrated circuit. In a preferred embodiment, the circuit performance simulation program comprises a layout parasitic extractor (LPE).

In operation, the various methods and apparatus of the invention provide a versatile, flexible, and accurate way of taking into account the presence of real-world structures which are present in a finished integrated circuit, but which may be absent from a physical layout or description of the integrated circuit at mid-stream between the initial design and the finished product. The methods and apparatus can be implemented as stand-alone circuit analysis tools, or can be incorporated into analytical tools which are already in existence.

For example, a number of different analytical tools can be calibrated using the inventive methods described above. The LPEs typically have a transformation function through which the physical design of an integrated circuit is translated into a computer-usable form in which parasitic capacitance values are represented. In accordance with one embodiment, the transformation function can be manipulated in accordance with the methods described above, to identify pertinent conductors and replace first dielectric material with the second dielectric material. After the manipulation of the transformation function, parasitic capacitance values can be extracted.

One class of analytical LPE tool uses empirical equations which are fixed functions of the physical parameters. Of that class of tools, manipulation of the transformation function can comprise specifying the different or differing dielectric constant(s) in the set up function of the tool. Such can be done through suitably programmed software routines directed to implementing the methods described above. In this regard, a stand-alone LPE tool of this type can be implemented.

Another class of LPE tools uses empirical functions with fitting parameters. This class of tools typically uses or depends on a field solver to generate values of capacitance for a set of calibration structures as physical features of the structures (active spacing, metal linewidth, etc.) as represented by the functional form of the empirical equations are varied. The empirical equations are then fit to these values. For this class of tools, manipulation of the transformation function can comprise specifying the different or differing dielectric constants based on the above-described methodologies to the field solver which generates the calibration values.

Another class of LPE tools actually performs field solutions based on physical information input to the tool. Of this class of tools, manipulation of the transformation function can comprise specifying the different or differing dielectric constants as a direct input to the tool.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A computer-implemented method of computing parasitic capacitances from a physical design of an integrated circuit comprising a plurality of layered conductors disposed within a first dielectric material, the method comprising:
    identifying at least one conductor of the plurality of conductors;
    for said identified at least one conductor, replacing a first dielectric material thereadjacent with a second dielectric material having a dielectric constant which is higher than the dielectric constant of the replaced dielectric material; and
    computing one or more parasitic capacitance values for the integrated circuit.

2. The computer-implemented method of claim 1, wherein said identifying comprises identifying said one conductor from the physical design.

3. The computer-implemented method of claim 1, wherein said first dielectric material has a first dielectric constant $\epsilon_1$, and said second dielectric material has a second dielectric constant $\epsilon_2$, and said replacing comprises selecting a scaling value $\alpha$ such that $\epsilon_2 = \alpha \epsilon_1$, said scaling value being sufficient such that one of said computed parasitic capacitances is within a predetermined range of an associated actual physical parasitic capacitance for the integrated circuit.

4. The computer-implemented method of claim 1, wherein said first dielectric material has a first dielectric constant $\epsilon_1$, and said second dielectric material has a second dielectric constant $\epsilon_2$, and said replacing comprises selecting a scaling value $\alpha$ such that $\epsilon_2 = \alpha \epsilon_1$, said scaling value being sufficient such that one of said computed parasitic capacitances is approximately equal to an associated actual physical parasitic capacitance for the integrated circuit.

5. The computer-implemented method of claim 1, wherein said first dielectric material has a first dielectric constant $\epsilon_1$, and said second dielectric material has a second dielectric constant $\epsilon_2$, and said replacing comprises selecting a scaling value $\alpha$ such that $\epsilon_2 = \alpha \epsilon_1$, said scaling value being sufficient such that one or more of said computed parasitic capacitances are within a predetermined range of one or more respectively associated actual physical parasitic capacitances for the integrated circuit.

6. The computer-implemented method of claim 1, wherein:
    said identifying comprises identifying a pair of laterally spaced-apart conductors, and
    said replacing comprises replacing said first dielectric material with said second dielectric material only if said spaced-apart conductors are separated by a distance greater than a predetermined distance.

7. The computer-implemented method of claim 1, wherein:
    said identifying comprises identifying a pair of laterally spaced-apart conductors, and
    said first dielectric material has a first dielectric constant $\epsilon_1$, and said second dielectric material has a second dielectric constant $\epsilon_2$, and wherein said replacing comprises selecting a scaling value $\alpha$ such that $\epsilon_2 = \alpha^{1/2} \epsilon_1$, and further comprising scaling a thickness of one of said conductors by a factor of $1/\alpha^{1/2}$ such that a computed parasitic capacitance comprising the coupling capacitance between said pair of laterally spaced-apart conductors is within a predetermined range of the associated actual physical coupling capacitance for the two conductors, and computed capacitances of other active metal structures are within a predetermined range of their associated actual physical parasitic capacitances.

8. The computer-implemented method of claim 1, wherein:
    said identifying comprises identifying a pair of laterally spaced-apart conductors, and
    said first dielectric material has a first dielectric constant $\epsilon_1$, and said second dielectric material has a second dielectric constant $\epsilon_2$, and wherein said replacing comprises selecting a scaling value $\alpha$ such that $\epsilon_2 = \alpha^{1/2} \epsilon_1$, and further comprising scaling a thickness of one of said conductors by a factor of $1/\alpha^{1/2}$ such that a computed parasitic capacitance comprising the coupling capacitance between said pair of laterally spaced-apart conductors is approximately equal to the associated actual physical parasitic coupling capacitance of said conductors.

9. The computer-implemented method of claim 1, wherein said replacing comprises spacing said second dielectric material a desired distance from said one conductor.

10. The computer-implemented method of claim 1, wherein said replacing comprises not spacing said second dielectric material from said one conductor.

11. The computer-implemented method of claim 1 further comprising defining a spacing value, and wherein said replacing comprises placing said second dielectric material no closer to said one conductor than said spacing value.

12. The computer-implemented method of claim 11, wherein said defining comprises selecting said spacing value such that a computed parasitic capacitance comprising a fringe capacitance of said one conductor is within a predetermined range relative to the associated actual physical parasitic fringe capacitance of said one conductor.

13. The computer-implemented method of claim 11, wherein said defining comprises selecting said spacing value such that a computed parasitic capacitance comprising a fringe capacitance of said one conductor is approximately equal to the associated actual physical parasitic fringe capacitance of said one conductor.

14. The computer-implemented method of claim 1, wherein said computing comprises using a field solver to compute said capacitances.

15. The computer-implemented method of claim 14, wherein said field solver is a two-dimensional field solver.

16. The computer-implemented method of claim 14, wherein said field solver is a three-dimensional field solver.

17. A computer-readable medium on which is stored a computer program comprising instructions which, when executed by a computer, perform the method of claim 1.

18. A computer-implemented method of computing parasitic capacitances from a physical design of an integrated circuit comprising a plurality of layered conductors disposed within a first dielectric material, the method comprising:

identifying a plurality of spaced-apart conductors, at least some of the conductors being spaced apart sufficiently to accommodate fill structure therebetween;

determining distances between individual conductors and next adjacent conductors;

comparing said distances with a predetermined distance value;

responsive to a determined individual distance exceeding said predetermined distance value, replacing said first dielectric material between an individual conductor and a next adjacent conductor which yielded said determined individual distance with a second dielectric material having a dielectric constant which is higher than the dielectric constant of the replaced dielectric material; and computing one or more parasitic capacitances for said plurality of conductors.

19. The computer-implemented method of claim 18, wherein said comparing ascertains individual areas of the integrated circuit's physical design within which fill structures are likely to be disposed.

20. The computer-implemented method of claim 18, wherein said replacing is conducted relative to conductors disposed at a common substrate elevation.

21. The computer-implemented method of claim 18, wherein said first dielectric material has a first dielectric constant $\epsilon_1$, and said second dielectric material has a second dielectric constant $\epsilon_2$, and said replacing comprises selecting a scaling value $\alpha$ such that $\epsilon_2 = \alpha \epsilon_1$, said scaling value being sufficient such that one of said computed parasitic capacitances for one conductor is within a predetermined range of one associated actual physical parasitic capacitance for the one conductor.

22. The computer-implemented method of claim 18, wherein said replacing comprises spacing said second dielectric material a desired distance from one of said individual or next adjacent conductors.

23. The computer-implemented method of claim 18 further comprising defining a spacing value, and wherein said replacing comprises placing said second dielectric material no closer to one of said individual or next adjacent conductors than said spacing value.

24. The computer-implemented method of claim 18, wherein said replacing comprises spacing said second dielectric material respective desired distances from said individual conductor and said next adjacent conductor.

25. The computer-implemented method of claim 18 further comprising defining a spacing value, and wherein said replacing comprises placing said second dielectric material no closer to either of said individual or next adjacent conductors than said spacing value.

26. The computer-implemented method of claim 25, wherein said defining comprises selecting said spacing value to substantially satisfy a design rule governing minimum conductor-to-fill structure spacing.

27. A computer-implemented method of calibrating a layout parasitic extractor (LPE) configured to extract parasitic capacitance values from a physical design of an integrated circuit comprising a plurality of layered conductors disposed within a dielectric material, the method comprising:

providing a layout parasitic extractor (LPE) configured to extract parasitic capacitance values from a physical design of an integrated circuit, the LPE having a transformation function through which the physical design is translated into a computer-usable form in which parasitic capacitance values are extracted;

manipulating the transformation function to identify at least one conductor of the plurality of conductors, and for said identified at least one conductor, replace dielectric material thereadjacent with a second dielectric material having a dielectric constant which is different from the dielectric constant of the replaced dielectric material; and after said manipulating of the transformation function, extracting said parasitic capacitance values.

28. The computer-implemented method of claim 27, wherein said manipulating of the transformation function to identify said at least one conductor comprises identifying a pair of conductors spaced apart sufficiently to accommodate placement of a fill structure therebetween, and wherein said replacing of the dielectric material thereadjacent comprises compensating for the actual parasitic capacitance imparted by the fill structure.

29. The computer-implemented method of claim 27, wherein said manipulating of the transformation function to identify said at least one conductor comprises identifying a pair of conductors spaced apart sufficiently to accommodate placement of a fill structure therebetween, and wherein said replacing of the dielectric material thereadjacent comprises spacing said second dielectric material a desired distance from both of said conductors.

30. The computer-implemented method of claim 27, wherein said different dielectric constant is greater than the dielectric constant of the replaced dielectric material.

31. The computer-implemented method of claim 27, wherein said LPE is of the class of LPEs which utilize a plurality of empirical equations which are fixed functions of physical parameters of the physical design, and said manipulating comprises specifying the different dielectric constant in the set up function of the LPE.

32. The computer-implemented method of claim 27, wherein said LPE is of the class of LPEs which use field solvers to compute a plurality of calibrations values, and said manipulating comprises specifying the different dielectric constants to the field solver.

33. The computer-implemented method of claim 27, wherein said LPE is of the class of LPEs which use field solvers to compute a plurality of calibrations values, and said manipulating comprises directly inputting a value representing the different dielectric constant of said second dielectric material into said field solver.

34. A computer-implemented method of calibrating a layout parasitic extractor (LPE) configured to extract parasitic capacitance values from a physical design of an integrated circuit comprising a plurality of layered conductors disposed within a first dielectric material, the method comprising:

providing a layout parasitic extractor (LPE) configured to extract parasitic capacitance values from a physical design of an integrated circuit, the LPE having a transformation function through which the physical design is translated into a circuit simulation input file; and manipulating the transformation function to include in the circuit simulation input file data representing material which is different from the first dielectric material and which is placed between two of the conductors.

35. The computer-implemented method of claim 34, wherein said manipulating comprises identifying from said physical design, an area between two of the conductors dimensioned to accommodate a metal fill structure therein, and placing said different material within said area, said different material having a dielectric constant sufficient to, upon computation of parasitic capacitances by said LPE, result in computed parasitic capacitances which are within predetermined ranges of associated actual physical parasitic capacitances.

36. A computer-readable medium on which is stored a computer program comprising instructions which, when executed by a computer, perform the method of claim 34.

37. In an integrated circuit performance simulation program, analyzing the parasitic capacitance effects which will be imparted to a fabricated integrated circuit by a finite-sized structure by replacing, for simulation purposes, the finite-sized structure with a simulated dielectric material having a dielectric constant selected to approximate said imparted parasitic capacitance effects.

38. The integrated circuit performance simulation program of claim 37, wherein said replacing comprises determining from a physical layout of the integrated circuit an area in which said finite-sized structure is to be located, said finite-sized structure not comprising a part of the physical layout.

39. The integrated circuit performance simulation program of claim 38, wherein said determining comprises examining the physical layout to ascertain said area laterally proximate a conductive structure, said replacing approximating the parasitic capacitance relative to said conductive structure.

40. The integrated circuit performance simulation program of claim 37, wherein said analyzing comprises extracting parasitic capacitance values from a physical layout of the integrated circuit after said replacing.

41. The integrated circuit performance simulation program of claim 37, wherein said simulation program comprises a layout parasitic extractor (LPE).

42. A layout parasitic extractor (LPE) comprising an extraction processor configured to compute parasitic capacitances from a physical design of an integrated circuit comprising a plurality of layered conductors disposed within a first dielectric material, said extraction processor being configured to:

identify a plurality of spaced-apart conductors, at least some of which can be spaced apart sufficiently to accommodate fill structure therebetween;

determine distances between individual conductors and next adjacent conductors;

compare said distances with a predetermined distance value;

responsive to a determined individual distance exceeding said predetermined distance value, replace, for computational purposes said first dielectric material between an individual conductor and a next adjacent conductor which yielded said determined individual distance with a second dielectric material having a dielectric constant which is higher than the dielectric constant of the replaced dielectric material; and compute one or more parasitic capacitances for said plurality of conductors.

* * * * *